United States Patent [19]

Wu et al.

[11] Patent Number: 4,777,061
[45] Date of Patent: Oct. 11, 1988

[54] BLANKET TUNGSTEN DEPOSITION FOR DIELECTRIC

[75] Inventors: Schyi-yi Wu, Mesa; J. B. Price, Scottsdale; John Mendonca, Tempe, all of Ariz.; Yu Chang Chow, Irvine, Calif.

[73] Assignees: Spectrum CVD, Inc., Phoenix, Ariz.;

[21] Appl. No.: 132,739

[22] Filed: Dec. 14, 1987

[51] Int. Cl.$^4$ .............................................. B05D 3/06
[52] U.S. Cl. ..................................... 427/39; 427/299; 427/314

[58] Field of Search ........................................... 427/39

Primary Examiner—Bernard Pianalto
Attorney, Agent, or Firm—Paul F. Wille

[57] ABSTRACT

A process is disclosed for depositing tungsten non-selectively on conductors and dielectrics without the use of an adhesive interlayer. The process comprises an argon pre-treatment followed by low power plasma deposition to nucleate the tungsten. A thick, adherent layer of tungsten is then deposited.

4 Claims, 1 Drawing Sheet

BLANKET TUNGSTEN DEPOSITION FOR DIELECTRIC

BACKGROUND OF THE INVENTION

This invention relates to chemical vapor deposition (CVD) and, in particular, to depositing tungsten nonselectively on dielectric or conductive materials.

The metal layer used to interconnect one or more devices in an integrated circuit is typically either polycrystalline silicon (hereinafter "poly") or aluminum. However, tungsten is an excellent alternative to these materials or can be used in conjunction with these materials. Tungsten has a lower resistivity than poly and is more resistant to electro-migration than aluminum. Tungsten has not been used as much as the other two materials because of the difficulty in obtaining an adherent layer, especially over dielectric materials.

Of the several ways to deposit tungsten, CVD is preferred to sputtering since CVD gives a more conformal step coverage. A problem arises in that the deposition is selective, i.e. the deposition occurs on metallic or conductive surfaces, but not on dielectric surfaces, such as silicon dioxide. In order to deposit tungsten on the surface of a dielectric, one must use an adhesion layer such as titanium, tungsten, or titanium-tungsten formed by sputtering or tungsten silicide formed by CVD. In addition, a plasma etch using nitrogen tri-fluoride is usually used to roughen the surface prior to depositing the adhesion layer. Further, the CVD deposition of tungsten uses silane, resulting in silicon being incorporated into the tungsten layer, which increases the resistivity thereof, e.g. twelve micro-ohm-centimeters is typical.

In view of the foregoing, it is therefore an object of the present invention to provide an adherent tungsten layer directly on dielectric materials.

Another object of the present invention is to provide a low resistivity blanket tungsten layer.

The foregoing objects are achieved in the present invention wherein it has been found that the combination of argon plasma pre-treatment followed by low power plasma deposition of tungsten from a mixture of hydrogen and tungsten hexafluoride followed by thermal deposition of tungsten yields a thick, adherent, low resistivity layer of tungsten, even on dielectrical materials.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
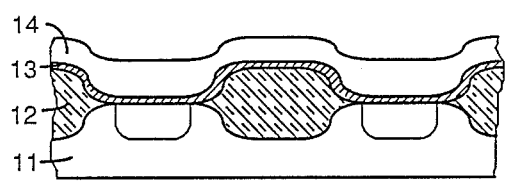
FIG. 1 illustrates a tungsten layer as formed by prior art processes.

FIG. 1 illustrates in cross-section a portion of a wafer processed in accordance with the prior art. Specifically, substrate 11 has a plurality of oxide regions 12 formed thereon. It is desired to deposit tungsten layer 14 to provide contact, for example, between diffused regions on the wafer. In accordance with the prior art, a very thin metal film had to be deposited onto the wafer prior to the blanket deposition of tungsten. This thin metal film functioned as an adhesive layer, bonding tungsten layer 14 to the wafer. This extra layer, illustrated in FIG. 1 as adhesive layer 13, could comprise sputtered or evaporated tungsten or titanium-tungsten or titanium. Alternatively, adhesive layer 13 could comprise a CVD layer of tungsten silicide. All of these alternatives introduce additional process steps and handling, all of which contribute to decreasing the yield of good die per wafer. Further, the use adhesive layer 13 does not assure that tungsten layer 14 will adhere under all circumstances. Further, some metals may add to the contact resistance on the diffused regions. They also add an extra process step and complicate the patterning of the tungsten layer because both layers 13 and 14 must be patterned and may not respond equally to the particular etch gas mixture chosen.

Figure 2:
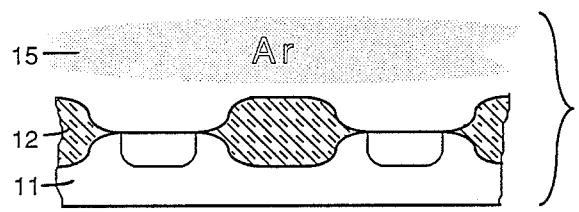
FIGS. 2-4 illustrate the process in accordance with the present invention.

In accordance with the present invention, as illustrated in FIG. 2, the wafer is subjected to argon plasma 15 which acts upon the surface of the dielectric to promote adhesion of the tungsten. It is believed that the argon interacts with oxide 12 to form dangling bonds at the surface thereof. These bonds are later filled with the deposited tungsten.

Figure 3:
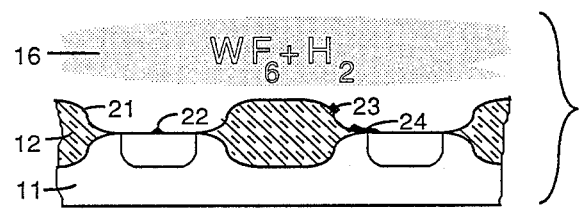

As illustrated in FIG. 3, the next step in the process in accordance with the present invention is to terminate the flow of argon and initiate the flow of hydrogen and tungsten hexafluoride. Plasma glow discharge 16 is formed in the tungsten hexafluoride which bonds at various locations on the surface of the wafer. These locations are nucleation cites 21-24 and occur relatively uniformly across the surface of the wafer. That is, the deposition is non-selective due to the plasma. Absent the nucleation sites and absent the plasma, the deposition would be selective and not take place on the dielectric.

In accordance with the present invention, the plasma used for the argon and hydrogen/tungsten hexafluoride steps is a low power plasma, on the order of twenty-five watts. The glow discharge in the hydrogen/tungsten hexafluoride is terminated after a short period of time, e.g. sixty seconds. In order to cause deposition, the wafer is heated above a threshold temperature, approximately 400° C. In the practice of the present invention, it has been found appropriate to heat the wafer to a temperature of approximately 600° C. during the plasma discharge in the tungsten hexafluoride gas.

Figure 4:
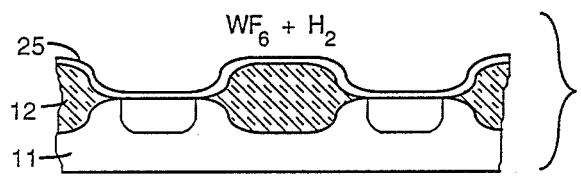

As illustrated in FIG. 4, the plasma is then terminated. The wafer continues to be maintained at a temperature 600° C., whereby the deposition proceeds by virtue of the thermal decomposition of the gas.

As can be seen by considering FIGS. 2-4 together, the present invention is distinctly different from the prior art in that the processing is carried out in a single chamber without handling the wafer between steps. Further, the gases are changed and the plasma is terminated prior to the completion of the deposition cycle. In one embodiment of the present invention, the deposition continued for six minutes, forming a tungsten layer approximately 963 nanometers thick at a deposition rate of approximately 138 nanometers per minute.

As another specific example of the present, a four inch wafer having the structure illustrated in FIG. 2 was subjected to an argon plasma of twenty-five watts power at a frequency 13.56 MHz, a pressure of 120 mtorr, a flow of 40 SCCM, and at a wafer temperature of 600° for sixty seconds. The wafer was then subjected to a plasma glow discharge in hydrogen/tungsten hexafluoride at a pressure of abut 120 mtorr; other parameters being kept the same. The flow of the hydrogen was 40 SCCM and the flow of the tungsten hexafluoride was 4 SCCM. The plasma was then terminated. A tungsten layer three microns thick was grown at the rate of 160 nm./minute. The tungsten layer did not peel.

Figure 5:
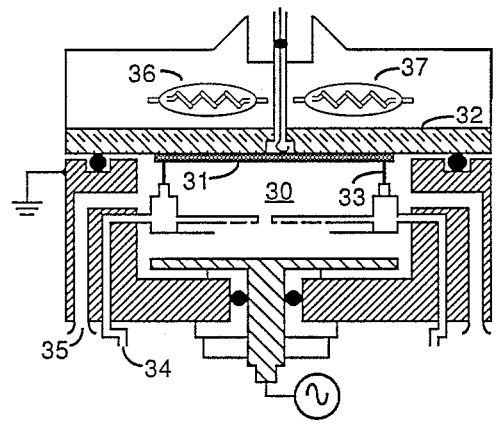
FIG. 5 illustrates apparatus useful for carrying out the present invention.

FIG. 5 illustrates apparatus suitable for carying out the present invention wherein plasma chamber 30 contains wafer 31 held against quartz window 32 by lift pins 33. Wafer 31 is heated to the desired temperature by way of lamps 36-37 which are disposed on the other side of window 32 from wafer 31. Gas is supplied to chamber 30 by way of aperture 34 and exhausted by way of suitable ports such as port 35. The plasma can be formed within chamber 30 or formed remotely and permitted to flow downstream to the vicinity of wafer 31 within chamber 30.

There is thus provided by the present invention of a greatly improved process for the blanket deposition of a tungsten layer. No adhesion layer is required, and no nitrogen tri-fluoride gas required. Further, pure tungsten is grown without the use of a silicon source. Further, the entire process takes place within a single chamber without the need to transport the wafer or expose the wafer to deleterious ambients between process steps.

Having thus described the present invention it will be apparent to those of skill in the art that various modifications can be made within the scope of the present invention. For example, instead of argon one can use nitrogen, or any other gas capable of inducing dangling bonds without etching or changing the electrical characteristics of the exposed silicon areas. The gas flows and the RF power can be varied to suit other materials. For example, an argon flow of 40-300 SCCM has been found effective. Ranges for other gases include 40-500 SCCM for nitrogen, and 4-20 SCCM for tungsten hexafluoride. RF power can be varied from 25-250 watts, with lower power preferred. The pressure in the chamber is preferably between 100 and 500 mtorr.

We claim:

1. A method for depositing an adherent refractory metal layer on a surface comprising the steps of:
   exposing said surface to a plasma glow discharge in an inert gas;
   exposing said surface to a plasma glow discharge in a gas mixture containing a refractory metal compound and a reducing gas; and
   terminating said plasma glow discharge while continuing to expose said surface to said gas mixture.

2. The method as set forth in claim 1 and further comprising the step of:
   heating said surface to a predetermined temperature.

3. The method as set forth in claim 2 wherein said heating step is an initial step and said heating continues throughout the process.

4. The method as set forth in claim 2 wherein said inert gas comprises argon.